(12) United States Patent
Finnigan

(10) Patent No.: US 7,023,210 B1
(45) Date of Patent: Apr. 4, 2006

(54) NMR SYSTEMS EMPLOYING INVERTED VARIABLE CAPACITORS

(75) Inventor: James Finnigan, Saratoga, CA (US)

(73) Assignee: Varian, Inc., Palo Alto, CA (US)

( * ) Notice: Subject to any disclaimer, the term of this patent is extended or adjusted under 35 U.S.C. 154(b) by 22 days.

(21) Appl. No.: 10/965,481

(22) Filed: Oct. 14, 2004

(51) Int. Cl.
*G01V 3/00* (2006.01)

(52) U.S. Cl. ...................... 324/318; 324/322
(58) Field of Classification Search ............... 324/318, 324/322, 319, 309, 307, 306, 300; 600/410
See application file for complete search history.

(56) References Cited

U.S. PATENT DOCUMENTS

| 4,876,627 | A | | 10/1989 | Mittler et al. |
| 5,155,654 | A | * | 10/1992 | Ditlya .................. 361/287 |
| 5,229,911 | A | | 7/1993 | Ditlya |
| 5,394,088 | A | * | 2/1995 | Cory ..................... 324/322 |
| 5,768,089 | A | | 6/1998 | Finnigan |
| 6,473,289 | B1 | | 10/2002 | Weisse et al. |
| 6,498,712 | B1 | | 12/2002 | Ditlya |
| 6,833,704 | B1 | * | 12/2004 | Murphy et al. ............ 324/318 |
| 2003/0028094 | A1 | * | 2/2003 | Kumar et al. ............... 600/410 |

OTHER PUBLICATIONS

Brochure by Voltronics Corporation entitled Voltronics Non-Magnetic Trimmer Capacitors, catalog was published in 1999 and became available to Applicant in 2001.

* cited by examiner

*Primary Examiner*—Brij B. Shrivastav
(74) *Attorney, Agent, or Firm*—Bella Fishman

(57) ABSTRACT

According to some embodiments, NMR (nuclear magnetic resonance) circuits include one or more variable capacitors each having two concentric cylindrical conductors. The inner conductor is connected to an upper external contact disposed closer to the NMR sample coil than the outer conductor. The inner conductor and upper contact are generally exposed to higher voltages than the outer conductor, and the upper contact is shorter than the outer conductor. Capacitance adjustment is performed by moving the inner conductor longitudinally within the outer conductor. Using a relatively short contact for the higher-voltage capacitor node allows reducing the surface area most conducive to arcing, and allows reducing lead lengths and stray capacitances. Shorting the capacitor may be performed by moving the inner conductor to contact a capacitor base situated opposite the upper external contact.

20 Claims, 4 Drawing Sheets

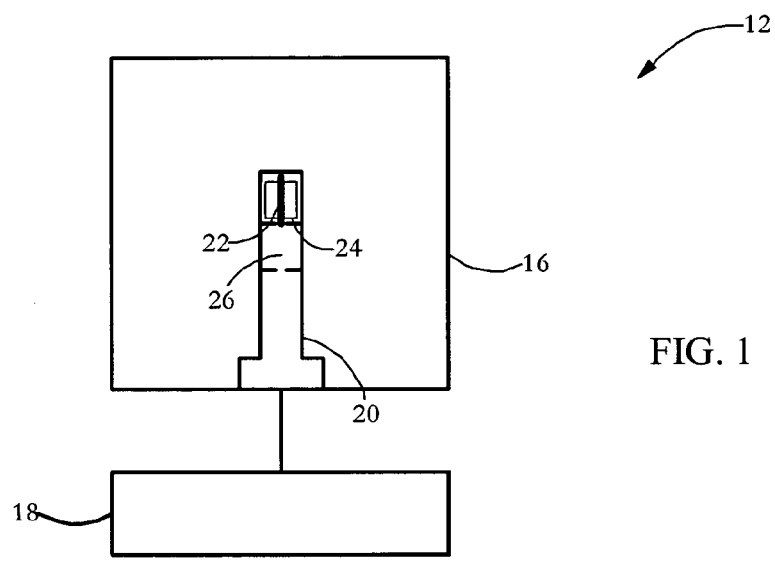
FIG. 1
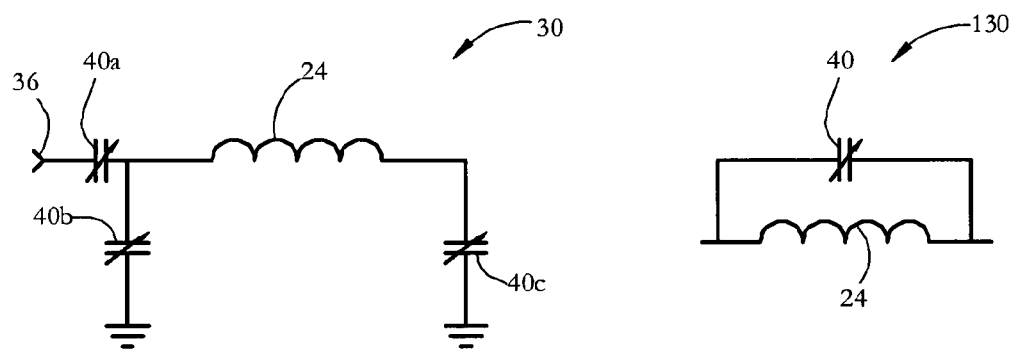
FIG. 2-A
FIG. 2-B

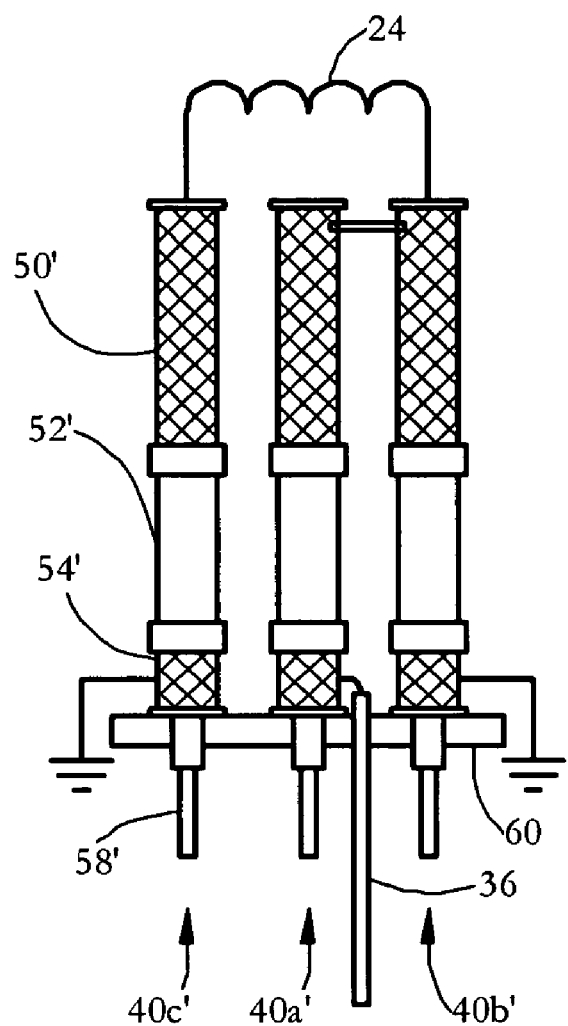
FIG. 3-A
PRIOR ART

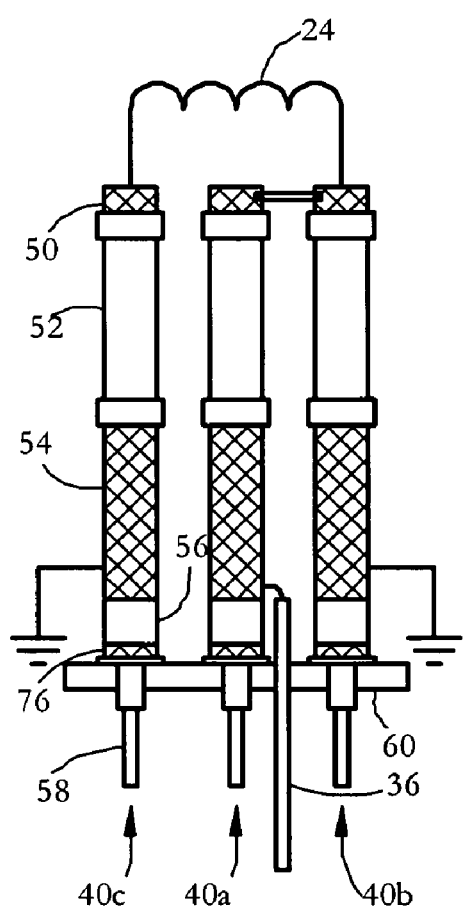
FIG. 3-B
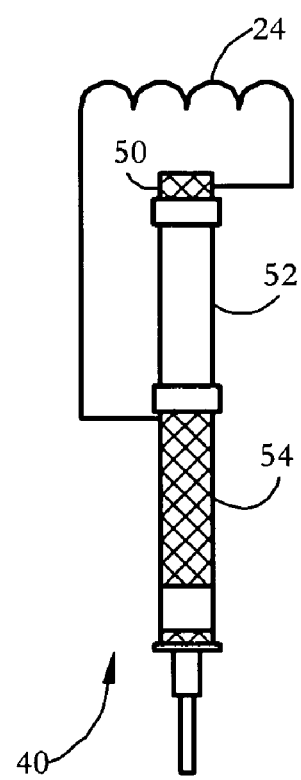
FIG. 3-C

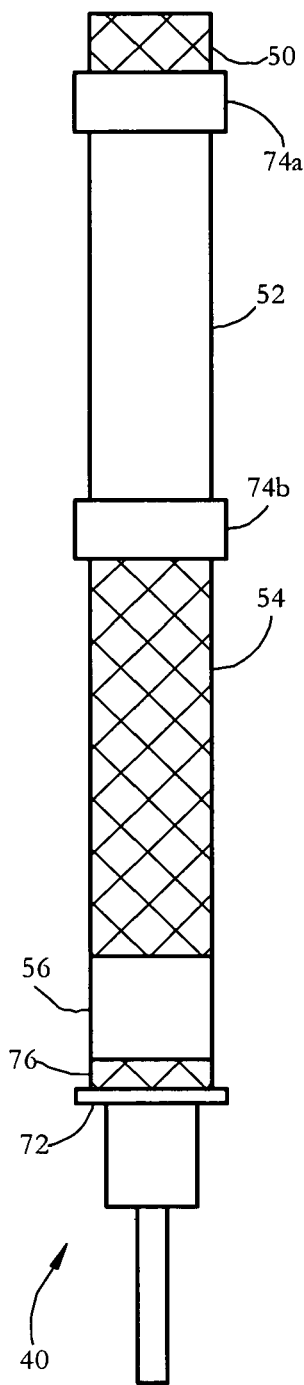
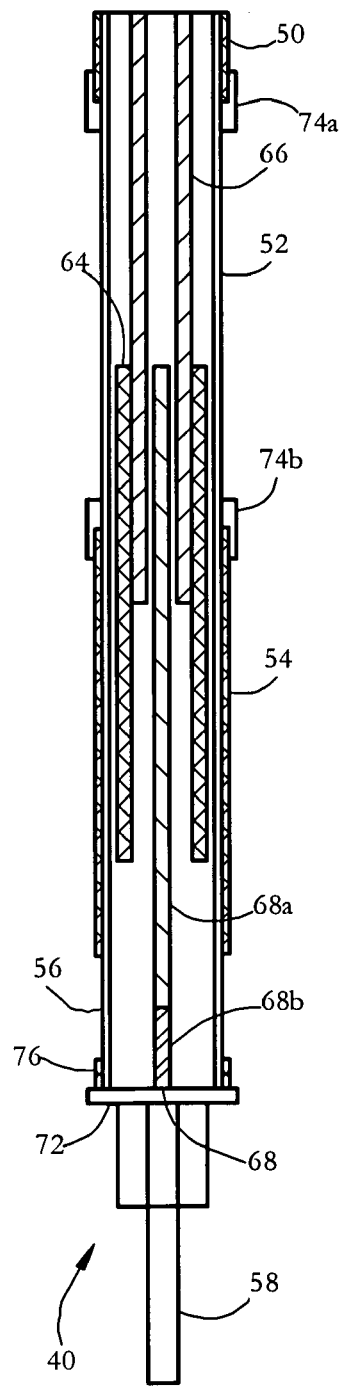
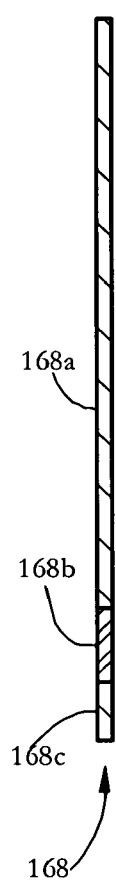
FIG. 4-A      FIG. 4-B      FIG. 4-C

NMR SYSTEMS EMPLOYING INVERTED VARIABLE CAPACITORS

FIELD OF THE INVENTION

The invention in general relates to nuclear magnetic resonance (NMR) spectroscopy, and in particular to systems and methods using variable capacitors for adjusting the resonant frequencies of NMR measurement circuits.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The RF coils are typically provided as part of an NMR probe, and are used to analyze samples situated in sample tubes or flow cells. The direction of the static magnetic field $B_0$ is commonly denoted as the z-axis, while the plane perpendicular to the z-axis is commonly termed the x-y or θ-plane.

The frequency of interest is determined by the nucleus of interest and the strength of the applied static magnetic field $B_0$. In order to maximize the accuracy of NMR measurements, the resonant frequency of the excitation/detection circuitry is set to be equal to the frequency of interest. The resonant frequency of the excitation/detection circuitry is generally $$v = 1/\sqrt{LC} \quad [1]$$

where L and C are the effective inductance and capacitance, respectively, of the excitation/detection circuitry.

Additionally, in order to maximize the transfer of RF energy into the RF coils, the impedance of each coil is matched to the impedance of the transmission line and associated components used to couple RF energy into the coil. If the coil is not impedance-matched, a sub-optimal fraction of the RF energy sent to the coil actually enters the coil. The rest of the energy is reflected out, and does not contribute to the NMR measurements.

Variable capacitors may be used to adjust the circuit resonant frequency and to ensure optimal impedance matching. Typical variable capacitors used in NMR applications are non-magnetic capacitors capable of operating at voltages on the order of several kV. Such variable capacitors are often placed in a space-constrained region within the nuclear magnetic resonance probe, for example in a region immediately underneath the NMR sample coil. The tight spaces available within typical NMR probes and the high voltages applied to such variable capacitors may lead to undesirable arcing from the capacitors to surrounding probe components held at lower voltages. In addition, some NMR circuits may suffer from undesirable stray capacitance, which may degrade the circuits' performance.

SUMMARY OF THE INVENTION

According to one aspect, the present invention provides a nuclear magnetic resonance apparatus comprising a nuclear magnetic resonance sample coil and a variable capacitor electrically connected to the sample coil. The capacitor comprises an outer cylindrical conductor, an inner cylindrical conductor longitudinally movable in a space defined within the outer cylindrical conductor, and an outer capacitor contact electrically connected to the inner cylindrical conductor. The outer capacitor contact is positioned closer to the sample coil than the outer cylindrical conductor.

According to another aspect, a nuclear magnetic resonance probe comprises a nuclear magnetic resonance sample coil disposed within a nuclear magnetic resonance probe, a generally-transverse base plate disposed below the sample coil in the nuclear magnetic resonance probe, and a set of generally-longitudinal variable capacitors mounted on the base plate and extending upward from the base plate. Each variable capacitor comprises an outer cylindrical conductor, an inner cylindrical conductor longitudinally movable in a space defined within the outer cylindrical conductor, and an outer capacitor contact electrically connected to the inner cylindrical conductor and situated along a top region of each variable capacitor.

BRIEF DESCRIPTION OF THE DRAWINGS

The foregoing aspects and advantages of the present invention will become better understood upon reading the following detailed description and upon reference to the drawings where:

FIG. 1 is a schematic diagram of an exemplary NMR spectrometer according to some embodiments of the present invention.

FIG. 2-A is a schematic diagram of a part of a tunable NMR probe circuit according to some embodiments of the present invention.

FIG. 2-B is a schematic diagram of a part of a tunable NMR probe circuit according to some embodiments of the present invention.

FIG. 3-A shows a side view of an exemplary arrangement of three prior-art capacitors in a nuclear magnetic resonance probe.

FIG. 3-B shows a side view of an exemplary arrangement of three variable capacitors in a nuclear magnetic resonance probe, according to some embodiments of the present invention.

FIG. 3-C shows a side view of a variable capacitor connected across a sample coil, according to some embodiments of the present invention.

FIG. 4-A shows a side view of a variable capacitor according to some embodiments of the present invention.

FIG. 4-B shows a side sectional view of the capacitor of FIG. 4-A.

FIG. 4-C shows a central shaft design suitable for use in a capacitor such as the one illustrated in FIGS. 4-A–B.

DETAILED DESCRIPTION OF THE INVENTION

In the following description, a set of elements includes one or more elements. For example, a set of rails may include one or more rails. Any reference to an element is understood to encompass one or more elements. Each recited element or structure can be formed by or be part of a monolithic structure, or be formed from multiple distinct structures. The statement that a coil is used to perform a nuclear magnetic measurement on a sample is understood to mean that the coil is used as transmitter, receiver, or both. Any recited electrical or mechanical connections can be direct connections or indirect connections through intermediary circuit elements or structures. Unless otherwise specified, the terms "high-voltage" and "low-voltage" are understood to be relative terms: a recited high voltage is understood to be higher than a recited low voltage.

The following description illustrates embodiments of the invention by way of example and not necessarily by way of limitation.

FIG. 1 is a schematic diagram illustrating an exemplary nuclear magnetic resonance (NMR) spectrometer 12 according to an embodiment of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include other similar coils. A sample container 22 is positioned within probe 20, for holding an NMR sample of interest within coil 24 while measurements are performed on the sample. Sample container 22 may be a sample tube or a flow cell. A number of electrical circuit components such as capacitors, inductors, and other components are situated in a circuit region 26 of probe 20, and are connected to coil 24. Coil 24 and the various components connected to coil 24 form one or more NMR measurement circuits. Circuit region 26 is situated adjacent to coil 24, immediately underneath coil 24.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. A single coil may be used to perform measurements at multiple frequencies, by tuning the resonant frequency of the NMR measurement circuit that includes the coil. Tuning the circuit resonant frequency may be achieved by adjusting the capacitance values of one or more variable capacitors included in the circuit.

FIG. 2-A shows a schematic diagram of a tunable NMR measurement circuit 30 according to some embodiments of the present invention. Measurement circuit 30 includes NMR sample coil 24 and a set of variable capacitors 40a–c connected to sample coil 24. Measurement circuit 30 may also include other components such as capacitors and inductors. An input terminal 36 receives external excitation pulses. A continuously-variable impedance-matching capacitor 40a is connected between input terminal 36 and the input (proximal) side of sample coil 24. The capacitance of capacitor 40a may be adjusted in order to optimize the impedance matching of circuit 30. Two continuously-variable capacitors 40b–c are connected between ground and the input and output sides of sample coil 24, respectively.

Suitable inductance and capacitance values for the various components shown in FIG. 2-A may be chosen according to the desired NMR application. In an exemplary implementation, sample coil 24 has an inductance on the order of hundreds of mH, for example about 250 mH. Variable capacitors 40a–c may take on continuously-adjustable values on the order of pF to tens of pF, for example 1–15 pF. The capacitance of capacitor 40a may be adjusted to provide impedance matching to 50 Ω. In an exemplary implementation, capacitors 40a–c have voltage ratings of 2500 V or higher.

FIG. 2-B is a schematic diagram of a tunable NMR probe circuit 130 according to other embodiments of the present invention. Circuit 130 includes sample coil 24 and a variable capacitor 40 connected across sample coil 24. Circuit 130 may also include other components such as capacitors and inductors. Such components may be connected to coil 24 as illustrated in FIG. 2-A, for example.

FIG. 3-A shows a side view of an exemplary arrangement of three prior-art capacitors 40a'–c' in a nuclear magnetic resonance probe. The illustrated arrangement corresponds to the circuit diagram of FIG. 2-A. Capacitors such as the ones shown in FIG. 3-A may be obtained commercially, for example from Voltronics Corporation, Denville, N.J. Sample coil 24 is illustrated schematically, as are the connections of capacitors 40b'–c' to ground. Capacitors 40b'–c' are connected between ground and the two sides of sample coil 24, respectively. Capacitor 40a' is connected between sample coil 24 and input terminal 36. Electrically conductive lateral surfaces of capacitors 40a'–c' are hatched in FIG. 3-A.

Capacitors 40a'–c' are mounted through apertures defined in a horizontal base plate 60. Capacitors 40a'–c' are structurally identical; the following description focuses on capacitor 40c' for simplicity. Capacitor 40c' includes a lower capacitor contact (electrode) 54' and an upper capacitor contact (electrode) 50'. Contacts 50', 54' are separated by an insulative region 52'. A capacitance-adjustment member 58' can be rotated to adjust the capacitance of capacitor 40c'. Adjustment member 58' protrudes underneath base plate 60. Lower contact 54' may be connected to a longitudinally-movable internal cylindrical rotor, while upper contact 50' may include a fixed external cylindrical stator. The longitudinal motion of the internal cylindrical rotor is controlled by the rotation of adjustment member 58'. Upper capacitor contact 50' is situated along a top end region of capacitor 40c', closer to sample coil 24 than lower capacitor contact 54'. Lower capacitor contact 54' is situated closer to base plate 60 than upper capacitor contact 50'. Upper capacitor contact 50' has a longer longitudinal extent than lower capacitor contact 54'. Generally, upper capacitor contact 50' is subjected to higher voltages than lower capacitor contact 54'.

FIG. 3-B shows a side view of an exemplary arrangement of three variable capacitors 40a–c in a nuclear magnetic resonance probe, according to some embodiments of the present invention. The illustrated arrangement corresponds to the circuit diagram of FIG. 2-A. Capacitor 40c includes an upper capacitor contact 50 and a lower capacitor contact 54. Contacts 50, 54 are separated by an insulative region 52. Another insulative region 56 separates lower capacitor contact 54 from base plate 60 and/or a shorting external contact 76 described below. A capacitance-adjustment member 58 can be rotated to adjust the capacitance of capacitor 40c. Adjustment member 58 protrudes underneath base plate 60. As described in detail below, upper contact 50 is connected to a longitudinally-movable internal cylindrical rotor, while lower contact 54 includes a fixed external cylindrical stator. Upper capacitor contact 50 is situated along a top end region of capacitor 40c', closer to sample coil 24 than lower capacitor contact 54'. Lower capacitor contact 54 is situated closer to base plate 60 than upper capacitor contact 50. Upper capacitor contact 50 has a shorter longitudinal extent than lower capacitor contact 54. Generally, upper capacitor contact 50 is subjected to higher voltages than lower capacitor contact 54.

FIG. 3-C shows a side view of a variable capacitor 40 connected across a sample coil, according to some embodiments of the present invention. The illustrated arrangement corresponds to the circuit diagram of FIG. 2-B. Capacitor 40 may be structurally identical to the capacitors 40a–c described above with reference to FIG. 3-B. For capacitor 40, the minimum lead length used to connect capacitor 40 to sample coil 24 depends approximately on the longitudinal extents (lengths) of insulative region 52 and upper contact 50. The corresponding lead length for a comparable capacitor in the configuration of FIG. 3-A depends on the longitudinal extents of insulative region 52' and upper contact 50'. In an exemplary implementation, the length of upper contact 50' (FIG. 3-A) is about 0.8", while the length of upper contact 50 (FIG. 3-C) is about 0.25". In such an implementation, the total lead length for the capacitor of FIG. 3-C is shorter by more than 0.5" than the lead length for a corresponding configuration using a capacitor such as the ones shown in FIG. 3-A.

FIG. 4-A shows a side view of variable capacitor 40, according to some embodiments of the present invention. FIG. 4-B shows a side sectional view of the capacitor of FIG. 4-A. Capacitor 4 includes two field-reduction bands 74a–b situated at the interfaces between contacts 50, 54 and region 52, respectively. Bands 74a–b may be formed by a material such as a room-temperature vulcanizing (RTV) silicone coating. Bands 74a–b serve to reduce arcing by reducing the electrical field intensity generated by geometrical irregularities at the longitudinal ends of contacts 50, 54. A capacitor base 72 may rest on an NMR probe base plate, as shown in FIG. 3-B. Capacitor base 72 is in a bottom region of capacitor 40, longitudinally opposite upper contact 50.

Lower capacitor contact 54 forms an outer cylindrical conductor (capacitor plate) of capacitor 40. The other capacitor plate is formed by an inner cylindrical conductor 64, which is electrically connected to upper capacitor contact 50. Cylindrical conductors 54, 64 are disposed concentrically within capacitor 40. Contacts 56, 54 may be formed by corresponding metallization regions defined on a dielectric or insulative substrate forming part of the capacitor side wall. In some embodiments, the insulative substrate may be a high-voltage polytetrafluoroethylene (PTFE, or Teflon@) dielectric. Insulative region 52 is defined by a bare region of the insulative substrate.

An internal threaded shaft 68 is rigidly coupled to adjustment member 58, which protrudes downward through base 72. Threaded shaft 68 extends upward from base 72, in the center of the cylindrical space defined in the interior of outer conductor 54. As illustrated, threaded shaft 68 includes a conductive section 68a longitudinally concatenated to an insulative section 68b. Conductive section 68a may be made of a metal, while insulative section 68b may be made of a ceramic material. Insulative section 68b breaks any electrical contact between inner conductor 64 and capacitor base 72. Threaded shaft 68 may also be formed from a single monolithic piece of insulative material, such as a ceramic. Also, threaded shaft 68 and adjustment member 58, or part of threaded shaft 68 and adjustment member 58 may be formed from a single monolithic rigid piece. Threaded shaft 68 is also coupled to a longitudinally-movable internal cylindrical conductor (rotor) 64, for example through a matching internal thread of internal conductor 64. A set of rigid, fixed longitudinal rails 66 fit through matching longitudinal grooves or channels defined in internal conductor 64. In some embodiments, capacitor 40 may include two or more rails 66 spaced apart azimuthally. Rails 66 prevent the rotation of internal conductor 64 as adjustment member 58 and shaft 68 are rotated. Rotating shaft 68 thus causes internal conductor 64 to move longitudinally. Rails 66 also transport current from upper contact 50 to internal conductor 64.

When internal conductor 64 is at its highest position, the capacitance of capacitor 40 takes on its minimal value. When inner conductor 64 is longitudinally aligned with (at the same height as) outer conductor 54, the capacitance of capacitor 40 takes on its maximal value. The capacitance of capacitor 40 may be adjusted between its minimal and maximal values by longitudinally moving inner conductor 64.

Shorting capacitor 40 may be achieved by connecting inner conductor 64 to a conductor situated in the lower part of capacitor 40. Such a conductor may be a transverse conductor connected to a shorting external contact 76 and/or capacitor base 72. A transverse conductor may be provided as part of base 72, or may be attached to base 72. For example, the transverse conductor may be a base plate 72 formed from a conductive material. Shorting capacitor 40 may be achieved by lowering inner conductor 64 until inner conductor 64 touches the transverse conductor, and connecting the transverse conductor and outer conductor 54 to the same potential (e.g. ground). The transverse conductor may be connected to a desired potential using shorting external contact 76.

FIG. 4-C shows another central shaft 168 suitable for use in a capacitor such as the one illustrated in FIGS. 4-A–B. Shaft 168 includes two conductive sections 168a,c longitudinally separated by an insulative section 168b. Section 168c is connected to the capacitor base, while section 168a is connected to the inner conductor. Insulative section 168b electrically insulates sections 168a, c from each other.

The exemplary embodiments described above allow a reduced circuit stray capacitance, reduced arcing potential, a reduced lead length when a capacitor is positioned across the NMR sample coil, and convenient shorting of the capacitors if desired. Stray capacitance is of particular concerns for NMR systems using relatively high magnetic field strengths and higher frequencies (>600 MHz). The effect of stray capacitance is exacerbated at high frequencies. At higher frequencies, shorter pulse widths are required due to larger chemical shifts. One way to reduce pulse widths at high frequencies is to increase pulse power. At the same time, increasing pulse power may increase the incidence of arcing. Reducing the stray capacitance allows the NMR probe to be tuned to higher frequencies, and reduces the potential for arcing to other probe components.

In the embodiments described with reference to FIGS. 4-A–B, the higher-voltage, upper capacitor contact is shorter and has a lower external surface area than the lower-voltage, lower capacitor contact. The reduced external surface area reduces the potential for arcing. The higher-voltage inner cylinder is situated in an inner position, and is less susceptible to arcing than the outer capacitor cylinder. Internalizing the high-potential end of the capacitor also allows reducing the stray capacitance of the capacitor to the environment.

Placing a variable capacitor across the leads of the NMR sample coil may allow increasing the frequency range the capacitor is able to tune over by factor of three or four. At the same time, adding a variable capacitor across the sample coil leads requires additional lead length, which may negatively affect circuit performance. If both capacitor cylinders are electrically connected upward, toward the sample coil, the exemplary designs described above allow reduced lead lengths for the variable capacitor connections. The lead length to the lower conductor depends on the relatively short length of the upper conductor, rather than the longer outer conductor.

The exemplary capacitor design shown in FIGS. 4-A–B also allows convenient shorting of the capacitor as described above. The high-potential inner cylinder of the capacitor is normally connected to the top side of the capacitor, but the inner cylinder can be brought all the way down to the capacitor base to establish a connection to the same potential as the outer cylinder.

The above embodiments may be altered in many ways without departing from the scope of the invention. For example, various known mechanisms other than a helical thread/rail mechanism may be used to move two capacitor conductors longitudinally relative to each other. Accordingly, the scope of the invention should be determined by the following claims and their legal equivalents.

What is claimed is:

1. A nuclear magnetic resonance apparatus comprising:
   a nuclear magnetic resonance sample coil; and
   a variable capacitor electrically connected to the sample coil, comprising:
      an outer cylindrical conductor,
      an inner cylindrical conductor longitudinally movable in a space defined within the outer cylindrical conductor, and
      an upper capacitor contact electrically connected to the inner cylindrical conductor; wherein the upper capacitor contact is positioned closer to the sample coil than the outer cylindrical conductor.

2. The apparatus of claim 1, wherein the variable capacitor comprises a longitudinal shaft disposed at least partially within the inner cylindrical conductor and coupled to the inner cylindrical conductor, the longitudinal shaft extending through the outer cylindrical conductor along an entire longitudinal extent of the outer cylindrical conductor.

3. The apparatus of claim 2, wherein:
   the longitudinal shaft is further coupled to a base of the variable capacitor, the base being situated longitudinally opposite the upper capacitor contact; and
   the longitudinal shaft comprises at least one electrically insulative portion situated to electrically insulate the inner cylindrical conductor from the base.

4. The apparatus of claim 3, wherein the longitudinal shaft is formed from an insulative material.

5. The apparatus of claim 3, wherein the longitudinal shaft further comprises a conductive portion coupled to the insulative portion.

6. The apparatus of claim 1, wherein:
   the inner cylindrical conductor has an inner helical thread;
   the variable capacitor further comprises a longitudinal rotatable shaft disposed at least partially within the inner cylindrical conductor;
   the rotatable shaft has an outer helical thread coupled to the inner helical thread of the inner cylindrical conductor; and
   the variable capacitor further comprises a set of longitudinal rails coupled to the inner cylindrical conductor, the set of longitudinal rails constraining a rotation of the inner cylindrical conductor, wherein rotating the rotatable shaft causes a longitudinal motion of the inner cylindrical conductor.

7. The apparatus of claim 1, wherein the variable capacitor is mounted on a top side of a base plate situated below the sample coil in a nuclear magnetic resonance probe, the upper capacitor contact being situated along a top region of the variable capacitor.

8. The apparatus of claim 1, wherein the inner cylindrical conductor forms a high-voltage node of a nuclear magnetic resonance circuit comprising the sample coil, and wherein the outer cylindrical conductor forms a low-voltage node of the nuclear magnetic resonance circuit.

9. The apparatus of claim 1, wherein:
   the variable capacitor further comprises an end contact situated on a longitudinal side of the variable capacitor opposite the upper capacitor contact; and
   the inner cylindrical conductor is longitudinally movable to contact the end contact.

10. The apparatus of claim 9, wherein the end contact and the outer cylindrical conductor are electrically coupled, whereby contacting the inner cylindrical conductor and the end contact shorts the variable capacitor.

11. A nuclear magnetic resonance probe comprising:
    a nuclear magnetic resonance sample coil disposed within a nuclear magnetic resonance probe;
    a generally-transverse base plate disposed below the sample coil in the nuclear magnetic resonance probe;
    a set of generally-longitudinal variable capacitors mounted on the base plate and extending upward from the base plate, each variable capacitor comprising an outer cylindrical conductor,
    an inner cylindrical conductor longitudinally movable in a space defined within the outer cylindrical conductor, and
    an upper capacitor contact electrically connected to the inner cylindrical conductor and situated along a top region of said each variable capacitor.

12. A nuclear magnetic resonance method comprising:
    adjusting a capacitance of a variable capacitor by performing a relative longitudinal motion of a capacitor inner cylindrical conductor disposed in a space defined within a capacitor outer cylindrical conductor, the inner cylindrical conductor being electrically connected to an upper capacitor contact, the upper capacitor contact being positioned closer to a sample coil than the outer cylindrical conductor; and
    employing a nuclear magnetic resonance circuit including the sample coil and the variable capacitor to perform a nuclear magnetic resonance measurement on a sample inserted into the sample coil.

13. The method of claim 12, wherein the variable capacitor comprises a longitudinal shaft disposed at least partially within the inner cylindrical conductor and coupled to the inner cylindrical conductor, the longitudinal shaft extending through the outer cylindrical conductor along an entire longitudinal extent of the outer cylindrical conductor.

14. The method of claim 13, wherein:
    the longitudinal shaft is further coupled to a base of the variable capacitor, the base being situated longitudinally opposite the upper capacitor contact; and
    the longitudinal shaft comprises at least one electrically insulative portion situated to electrically insulate the inner cylindrical conductor from the base.

15. The method of claim 14, wherein the longitudinal shaft comprises a longitudinal section formed from an insulative material.

16. The method of claim 12, further comprising rotating a rotatable shaft to perform the relative longitudinal motion of the inner cylindrical conductor, the rotatable shaft being coupled to the inner cylindrical conductor through a helical thread, a rotation of the inner cylindrical conductor being constrained by a set of longitudinal rails coupled to the inner cylindrical conductor.

17. The method of claim 12, wherein the variable capacitor is mounted on a top side of a base plate situated below the sample coil in a nuclear magnetic resonance probe, the upper capacitor contact being situated along a top region of the variable capacitor.

18. The method of claim 12, wherein the inner cylindrical conductor forms at least part of a high-voltage node of a nuclear magnetic resonance circuit comprising the sample coil, and wherein the outer cylindrical conductor forms at least part of a low-voltage node of the nuclear magnetic resonance circuit.

19. The method of claim 12, further comprising longitudinally moving the inner cylindrical conductor to contact an end contact situated on a longitudinal side of the variable capacitor opposite the upper capacitor contact.

20. The method of claim 19, further comprising shorting the variable capacitor by electrically coupling the end contact and the outer cylindrical conductor.

* * * * *